United States Patent
Noritake et al.

(10) Patent No.: US 8,530,281 B2
(45) Date of Patent: Sep. 10, 2013

(54) PRODUCTION METHOD OF SEMICONDUCTOR MODULE WITH RESIN-MOLDED ASSEMBLY OF HEAT SPREADER AND SEMICONDUCTOR CHIP

(75) Inventors: Chikage Noritake, Aichi-ken (JP); Tsuyoshi Arai, Nagoya (JP); Naoki Hiraiwa, Toyokawa (JP)

(73) Assignee: Denso Corporation, Kariya (JP)

( * ) Notice: Subject to any disclaimer, the term of this patent is extended or adjusted under 35 U.S.C. 154(b) by 239 days.

(21) Appl. No.: 13/167,140

(22) Filed: Jun. 23, 2011

(65) Prior Publication Data

US 2011/0318884 A1 Dec. 29, 2011

(30) Foreign Application Priority Data

Jun. 23, 2010 (JP) .................................. 2010-143059

(51) Int. Cl.
*H01L 21/50* (2006.01)
(52) U.S. Cl.
USPC .................................. 438/122; 257/E21.499
(58) Field of Classification Search
USPC .................................. 438/122; 257/E21.499
See application file for complete search history.

(56) References Cited

U.S. PATENT DOCUMENTS

| 8,277,597 B2* | 10/2012 | Yamamoto | 156/286 |
| 2006/0096299 A1 | 5/2006 | Mamitsu et al. | |
| 2009/0302444 A1* | 12/2009 | Ueda et al. | 257/675 |
| 2010/0081237 A1* | 4/2010 | Wong et al. | 438/127 |
| 2011/0186981 A1* | 8/2011 | Fukuoka et al. | 257/690 |
| 2011/0316142 A1* | 12/2011 | Noritake et al. | 257/713 |
| 2011/0316143 A1* | 12/2011 | Noritake et al. | 257/713 |
| 2012/0001341 A1* | 1/2012 | Ide et al. | 257/773 |

FOREIGN PATENT DOCUMENTS

JP 4225310 12/2008

* cited by examiner

*Primary Examiner* — Alexander Ghyka
*Assistant Examiner* — Stanetta Isaac
(74) *Attorney, Agent, or Firm* — Nixon & Vanderhye P.C.

(57) ABSTRACT

A method of producing a semiconductor module which includes a resin molded package and a coolant passage is provided. The resin molded package is made up of a thermosetting resin-made mold and a thermoplastic resin-made mold. The resin molded package is formed by making the thermoplastic resin-made mold, placing the thermoplastic resin-made mold and a semiconductor sub-assembly made up of a power semiconductor chip, heat spreaders, terminals, etc., and then forming the thermosetting resin-made mold. Specifically, the thermosetting resin-made mold is made after the thermoplastic resin-made mold, thereby creating a high degree of adhesion of the thermosetting resin-made mold to the thermoplastic resin-made mold before the thermosetting resin-made mold is hardened completely, thereby forming firmly an adhered interface between the thermosetting resin-made mold and the thermoplastic resin-made mold. This minimizes the risk of occurrence of air gaps at the adhered interface and avoids the leakage of the coolant outside the resin molded package.

10 Claims, 8 Drawing Sheets

PRODUCTION METHOD OF SEMICONDUCTOR MODULE WITH RESIN-MOLDED ASSEMBLY OF HEAT SPREADER AND SEMICONDUCTOR CHIP

CROSS REFERENCE TO RELATED DOCUMENT

The present application claims the benefit of priority of Japanese Patent Application No. 2010-143059 filed on Jun. 23, 2010, the disclosure of which is incorporated herein by reference.

BACKGROUND OF THE INVENTION

1. Technical Field

The present invention relates generally to a production method of a semiconductor module which is equipped with a resin-molded package of a power semiconductor chip and a heat spreader working to spread heat from the power semiconductor chip and which may be of a 1-in-1 structure into which a single power semiconductor chip(s) such as an IGBT or a power MOSFET for use as either of an upper arm (i.e., a high side device) or a lower arm (i.e., a low side device) of an inverter is resin-molded, or a 2-in-1 structure into which two power semiconductor chips for use as the upper and lower arms, respectively, are resin-molded.

2. Background Art

One of typical semiconductor modules is equipped with a resin mold package in which a semiconductor chip(s) and a heat spreader(s) serving to dissipate heat, as generated by the semiconductor chip, are disposed. As the resin material for such mold, thermosetting resin such as epoxy resin is usually used in order to improve thermal endurance of the package.

The thermosetting resin is, however, difficult to break down after being hardened. Therefore, when any part of the thermosetting resin has broken down, the expensive semiconductor chip must also be scrapped.

In recent years, a demand for reusing the semiconductor chips has been increasing with increasing awareness of environmental issues.

Japanese Patent First Publication No. 2006-165534 teaches a semiconductor module which consists of stacked resin molded packages and coolant paths. In each of the resin molded packages, a power semiconductor chip(s) and heat spreaders are embedded. When one of the resin molded packages has become defective, the semiconductor module may be disassembled to remove only the defective package and reused by replacing it with a new one.

However, when the resin molded package is removed from the semiconductor module, the surfaces of the packages are susceptible to damage. It is undesirable to replace such a resin molded package itself. Such damage causes deterioration of quality of the mold and results in need for the package to be scrapped even though the power semiconductor chip which is embedded in the package operates properly.

The semiconductor module, as taught in the above publication, may be reused by replacing one of the resin molded packages which has been broken down with a new one. However, when the power semiconductor chip of one of the resin molded packages is operating properly, but its resinous mold is scratched during disassembling of the stack of the resin molded packages, the need usually arises for replacing the resin molded package, That rein molded package will, however, be removed even though the power semiconductor chip thereof operates properly. This is undesirable in terms of efficiency in utilization of limited resources.

In order to alleviate the above problem, the inventors of this application have devoted themselves to studying the structure of the semiconductor module which enables the power semiconductor chip to be reused when the surface of any one of the resin molded packages is scratched. Specifically, the resin molded package is made up of a thermosetting resin-made body and a thermoplastic resin-made shell. The thermosetting rein-made body has components such as the power semiconductor chip, etc. embedded therein. The thermoplastic resin-made shell is wrapped around an outer circumference of the thermosetting resin-made body and has a coolant passage formed therein. This structure enables one of the rein molded packages to be detached from the semiconductor module if it is scratched and heated to soften and remove the thermoplastic resin-made shell, thereby taking only the thermosetting resin-made body in which the power semiconductor chip is disposed out of the resin molded package. The rebuilding of the resin molded package may be achieved by placing the thermosetting resin-made body within a molding tool and injecting thermoplastic resin into the molding tool to form the thermoplastic resin-made shell around the thermosetting resin-made body again.

This enables the power semiconductor chips to be reused when the surface of the resin molded package is scratched. This is very useful for the case where one of the resin molded packages is scratched during disassembling of the semiconductor module to take out another of the resin molded packages which has become defective.

We have however, found that the above structure of the resin molded packages made up of two resin molds: the thermosetting resin-made body and the thermoplastic resin-made shell faces the following problem.

The formation of the thermoplastic resin-made shell after the thermosetting resin-made body is made results in a lack of adhesion between them, which may cause air gaps to appear at the interface between the thermoplastic resin-made shell and the thermosetting resin-made body, thus leading to leakage of the coolant to the power semiconductor chip in the thermosetting resin-made body.

Figure 10A:
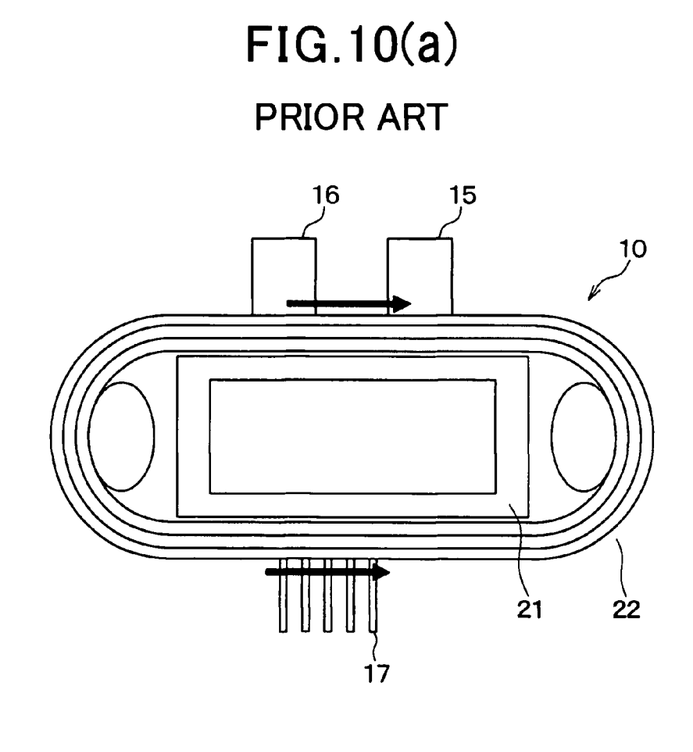
FIG. 10(a) is a plane view which shows a conventional resin molded package.
Figure 10B:
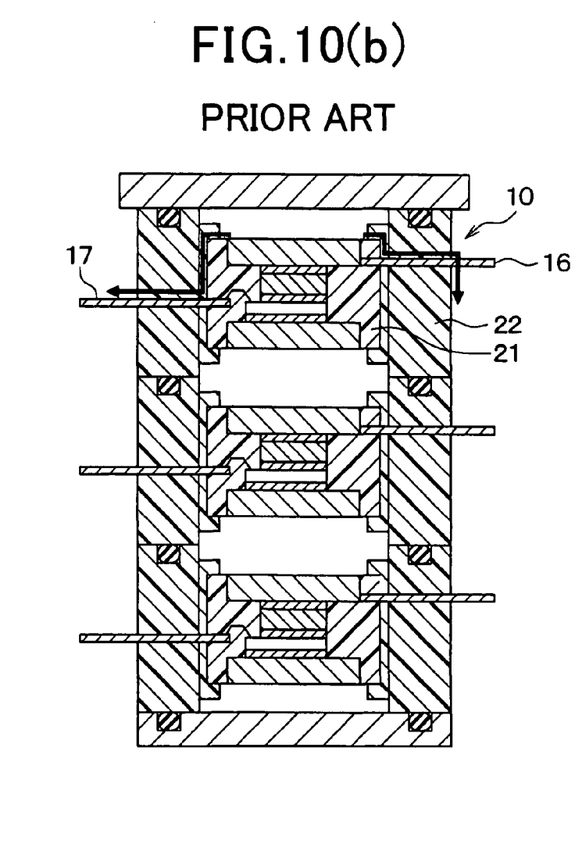
FIG. 10(b) is a vertical sectional view which shows a conventional semiconductor module equipped with the resin molded package of FIG. 10(a).

FIGS. 10(a) and 10(b) demonstrate an example of such leakage of coolant within a semiconductor module made up of a stack of resin molded packages 10.

Each of the resin molded packages 10 is equipped with a positive electric terminal 15 connecting with a collector of an IGBT, negative electric terminal 16 connecting with an emitter of the IGBT, and signal terminals 17 for use in sensing given parameters. The positive electric terminal 15, the negative electric terminal 16, and the signal terminals 17 are partially exposed outside the resin molded package 10. When an air gap occurs between the thermosetting resin-made body 21 and thermoplastic resin-made shell 22, it may cause, as indicated by solid lines in FIG. 10(b), the coolant to leak into the air gap from a coolant passage and flow out of the resin molded package 10 to the exposed portions of the leads 15 and 16 and the signal terminals 17. This may, as indicated by solid lines in FIG. 10(a), result in electrical leakage between the positive electric terminal 15 and the negative electric terminal 16 or among the signal terminals 17.

SUMMARY

It is therefore an object to provide an improved structure of a semiconductor module which is equipped with a resin molded package and designed to enable a power semiconductor chip embedded in the resin molded package to be reused and also minimize the possibility of creating an air gap which leads to leakage of coolant flowing within the semiconductor module.

According to one aspect of an embodiment, there is provided a method of producing a semiconductor module which may be employed with an inverter for an electric motor and includes a resin molded package and a coolant path. The production method comprises: (a) a first step of preparing a semiconductor sub-assembly of a power semiconductor chip, a first heat spreader, a second heat spreader, and electric terminals, the power semiconductor chip having a first and a second surface opposed to each other and being equipped with a semiconductor power device connecting with the electric terminals; (b) a second step of forming a thermoplastic resin-made mold which defines a shell of the resin molded package; (c) a third step of placing the thermoplastic resin-made mold and the semiconductor sub-assembly in a given molding tool and then forming a thermosetting resin-made mold inside the thermoplastic resin-made mold to make, as the resin molded package, a resin-molded assembly in which a coolant path defining said coolant pat is formed, the first heat spreader being disposed in connection with the first surface of the power semiconductor chip, the second heat spreader being disposed in connection with the second surface of the power semiconductor chip, each of the electric terminals having a portion exposed from the resin-molded assembly, material for the thermosetting resin-made mold being higher in glass transition temperature than that for the thermoplastic resin-made mold; and (e) a fourth step of holding the resin molded package through covers to complete the semiconductor module.

Specifically, the thermosetting resin-made mold is made after the thermoplastic resin-made mold, This will cause a high degree of adhesion of the thermosetting resin-made mold to the thermoplastic resin-made mold to be created before the thermosetting resin-made mold is hardened completely, thereby forming firmly an adhered interface between the thermosetting resin-made mold and the thermoplastic resin-made mold. This minimizes the risk of occurrence of air gaps at the adhered interface and avoids the leakage of the coolant outside the resin molded package.

In the preferred mode of the embodiment, the third step injects thermosetting resin into the molding tool within which the thermoplastic resin-made mold and the semiconductor sub-assembly axe already disposed to form the thermosetting resin-made mold.

The third step places the thermoplastic resin-made mold away from the electric terminals of the semiconductor sub-assembly within the molding tool and injects thermosetting resin also into an air gap between the thermoplastic resin-made mold and the electric terminals, This also results in a high degree of adhesion between the terminals and the resin-molded assembly.

The thermosetting resin may be one of epoxy, phenol, silicone, and urethane.

The thermoplastic resin may be one of polyphenylene sulfide, polybutylene terephthalate, nylon, polyethylene, and polypropylene.

According to another aspect of the invention, there is provided a method of producing a semiconductor module which includes resin molded packages and a coolant path. The production method comprises: (a) a first step of preparing a semiconductor sub-assembly of a power semiconductor chip, a first heat spreader, a second heat spreader, and electric terminals, the power semiconductor chip having a first and a second surface opposed to each other and being equipped with a semiconductor power device connecting with the electric terminals; (b) a second step of forming a thermoplastic resin-made mold which defines a shell of the resin molded package; (c) a third step of placing the thermoplastic resin-made mold and the semiconductor sub-assembly in a given molding tool and then forming a thermosetting resin-made mold inside the thermoplastic resin-made mold to make, as one of the resin molded packages, a resin-molded assembly in which a coolant path defining said coolant path is formed, the first heat spreader being disposed in connection with the first surface of the power semiconductor chip, the second heat spreader being disposed in connection with the second surface of the power semiconductor chip, each of the electric terminals having a portion exposed outside the resin-molded assembly, material for the thermosetting resin-made mold being higher in glass transition temperature than that for the thermoplastic resin-made mold; (d) a fourth step of performing the first, second, and third step to make another of the resin molded packages; and (e) a fifth step of making a stack of the resin molded packages as a package stack and holding the package stack through covers to complete the semiconductor module.

Specifically, the thermosetting resin-made mold is made after the thermoplastic resin-made mold in each of the resin molded packages. This will cause a high degree of adhesion of the thermosetting resin-made mold to the thermoplastic resin-made mold to be created before the thermosetting resin-made mold is hardened completely, thereby forming firmly an adhered interface between the thermosetting resin-made mold and the thermoplastic resin-made mold. This minimizes the risk of occurrence of air gaps at the adhered interface and avoids the leakage of the coolant outside the resin molded package.

In the preferred mode of the embodiment, the third step injects thermosetting resin into the molding tool within which the thermoplastic resin-made mold and the semiconductor sub-assembly are already disposed to form the thermosetting resin-made mold.

The third step places the thermoplastic resin-made mold away from the electric terminals of the semiconductor sub-assembly within the molding tool and injects thermosetting resin also into an air gap between the thermoplastic resin-made mold and the electric terminals.

The thermosetting resin may be one of epoxy, phenol, silicone, and urethane.

The thermoplastic resin may be one of polyphenylene sulfide, polybutylene terephthalate, nylon, polyethylene, and polypropylene.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIG. 1(*a*) is a vertical cross sectional view, as taken along the line B-B' in FIG. 1(*b*), which shows a semiconductor module according to the first embodiment;

FIG. 1(*b*) is a vertical cross sectional view, as taken along the line A-A' of FIG. 1(*a*);

FIG. 2(*a*) is a plane view which show one of resin molded packages built in the semiconductor module of FIG. 1;

FIG. 2(*b*) is a cross sectional view, as taken along the line C-C' of FIG. 2(*a*);

DESCRIPTION OF THE PREFERRED EMBODIMENTS

Referring to the drawings, wherein like reference numbers refer to like parts in several views, there is shown a semiconductor module 1 with a cooling mechanism which is produced by a production method according to the first embodiment.

Figure 1A:
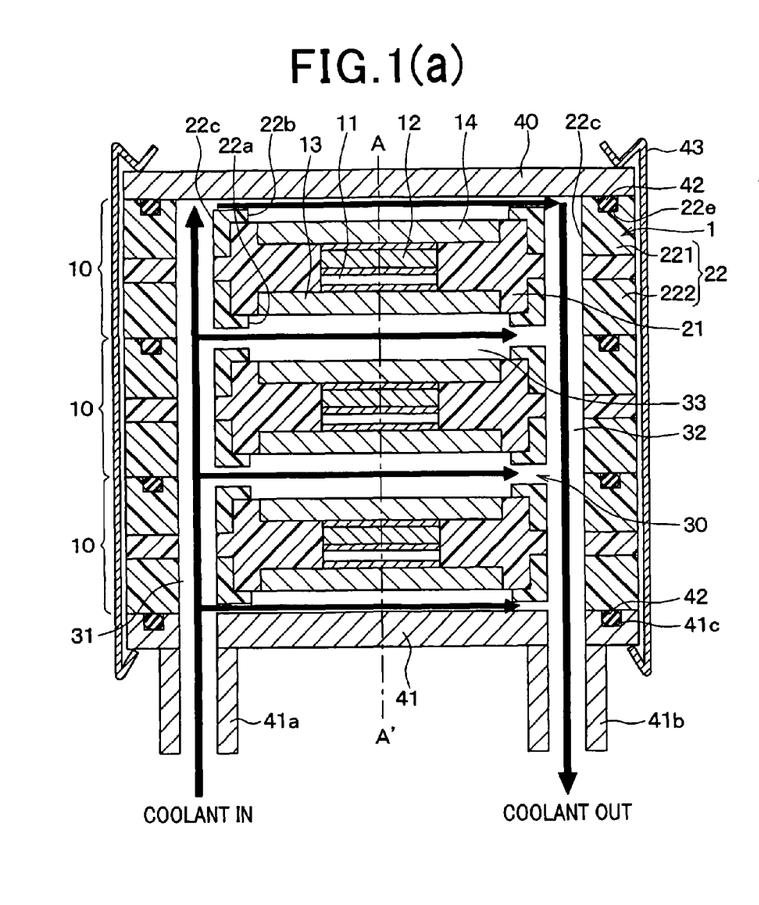
Figure 1B:
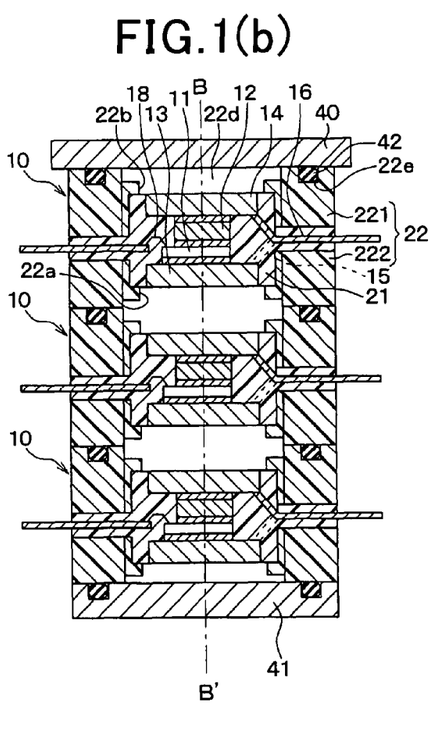

FIGS. 1(a) and 1(b) are vertical cross sectional front and side view which illustrate the semiconductor module 1. FIG. 1(a) is taken along the line B-B' of FIG. 1(b). FIG. 1(b) is taken along the line A-A' of FIG. 1(a).

The semiconductor module 1 includes a stack of resin molded packages 10. Each of the resin molded packages 10 is equipped with a power semiconductor chip 11. The resin molded packages 10 are substantially identical in structure with each other, and the following discussion will be referred to only one of the resin molded packages 10 for the simplicity of disclosure.

Figure 2A:
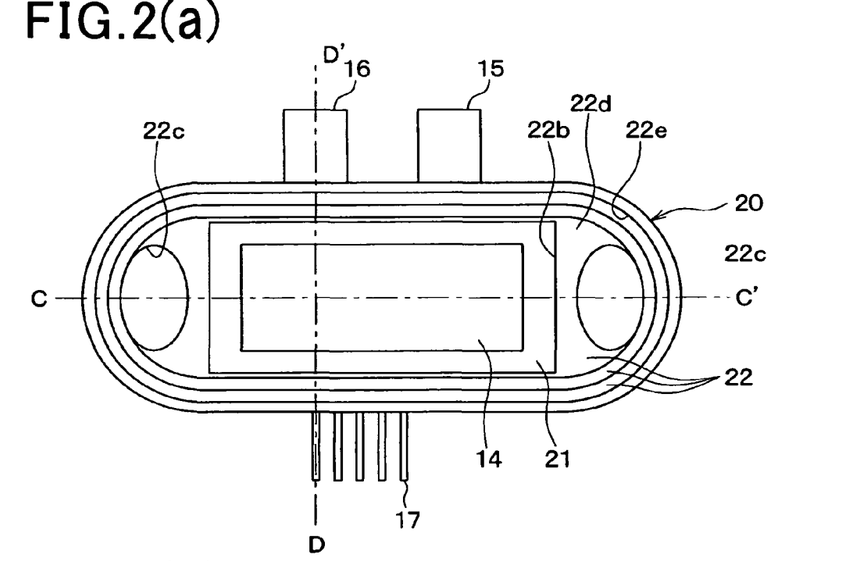
Figure 2B:
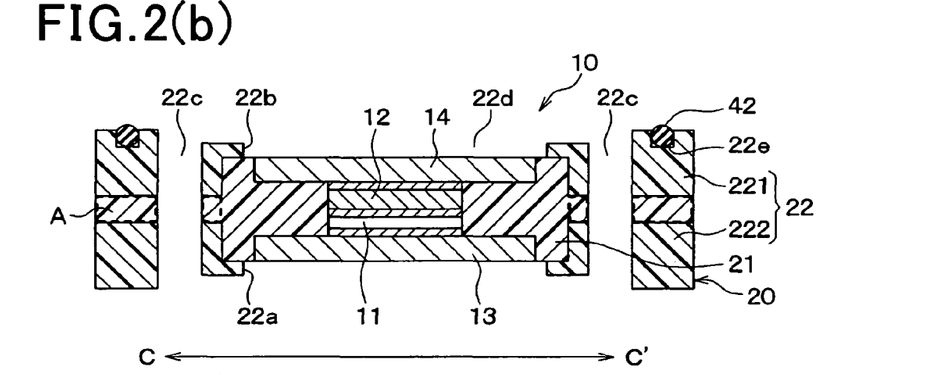
Figure 2C:
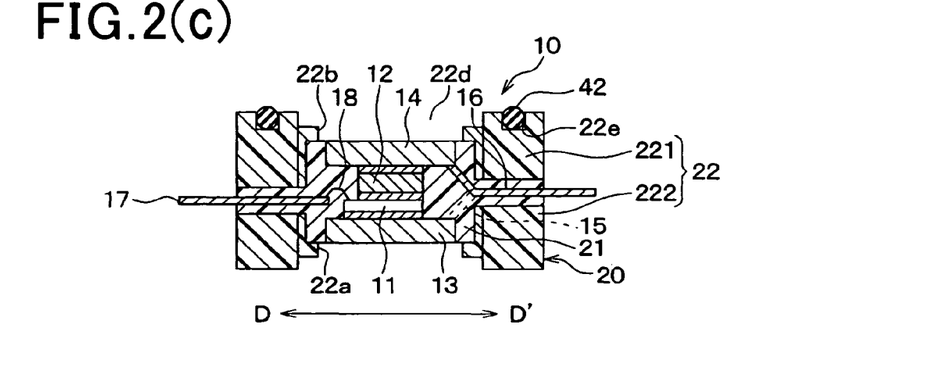
FIG. 2(c) is a cross sectional view, as taken along the line D-D' of FIG. 2(a)

FIGS. 2(a) to 2(c) illustrate the structure of the resin molded package 10. FIG. 2(a) is a front view of the resin molded package 10. FIG. 2(b) is a cross sectional view, as taken along the line C-C' of FIG. 2(a). FIG. 2(c) is a cross sectional view, as taken along the line D-D' of FIG. 2(c).

The resin molded package 10 also includes a metal block 12, heat spreaders 13 and 14, a positive electric terminal 15, a negative electric terminal 16, and signal terminals 17. The power semiconductor chip 11, the metal block 12, the heat spreaders 13 and 14, the positive electric terminal 15, the negative electric terminal 16, and the signal terminals 17 are molded by resin into a single resin-molded assembly 20 as the resin molded package 10.

The resin molded package 10 is of a 1-in-1 structure equipped with the single power semiconductor chip 11, but may alternatively be designed to have two or more power semiconductor chips 11.

In this embodiment, the power semiconductor chip 11 is equipped with a semiconductor power chip such as an IGBT which is of a vertical type in which electric current flows in a thickness-wise direction thereof. The power semiconductor chip 11 has some types of pads disposed on a first and a second surface thereof. Specifically, the pads are formed on the first surface of the power semiconductor chip 11 in electrical connection with a gate and an emitter of the IGBT, while the pad is formed on the entire area of the second surface of the power semiconductor chip 11 in electrical connection with a collector of IGBT.

The power semiconductor chip 11 is of a horizontal type in which the current flows in a lateral direction of a base thereof.

The metal block 12 is made of a metallic material such as copper or aluminum which is high in thermal conductivity. The metal block 12 is glued or soldered mechanically and electrically to the pad which is formed on the first surface of the power semiconductor chip 11 and connected to the emitter of the IGBT. The metal block 12 is disposed on the first surface of the power semiconductor chip 11 to secure an interval between the first surface of the power semiconductor chip 11 and the heat spreader 14.

Each of the heat spreaders 13 and 14 spreads heat generated by the power semiconductor chip 11. The heat spreader 13 is also joined mechanically and electrically to the pad on the second surface of the power semiconductor chip 11 and additionally serves as an electric lead coupled with the collector of the IGBT. The heat spreader 14 is secured mechanically and electrically to the metal block 12 and additionally serves as an electric lead coupled with the emitter of the IGBT. Each of the heat spreaders 13 and 14 is made of a metallic material such as copper that is high in thermal conductivity and formed by a square metallic plate of a given thickness. The surface of each of the heat spreaders 13 and 14 which is farther away from the power semiconductor chip 11 is exposed from the resin-molded assembly 20 to coolant, as will be described later in detail. This surface of each of the heat spreaders 13 and 14 also has disposed thereon an insulating member (not shown) for use in insulating the heat spreaders 13 and 14 from the cooling water to avoid the leakage of electric current from the heat spreaders 13 and 14 to the coolant.

The positive electric terminal 15 is formed integrally with the heat spreader 13 as a part thereof or soldered or welded thereto, so that it is coupled electrically with the pad which is affixed to the second surface of the power semiconductor chip 11 and leads to the collector of the IGBT. The end of the positive electric terminal 15 is exposed from the resin-molded assembly 20 for electric connection with an external device.

The negative electric terminal 16 is formed integrally with the heat spreader 14 as a part thereof or soldered or welded thereto, so that it is coupled electrically with the pad which is affixed to the first surface of the power semiconductor chip 11 and leads to the emitter of the IGBT. One of ends the negative electric terminal 16 which is farther away from the heat spreader 14 is exposed from the resin-molded assembly 20 for electric connection with an external device.

The signal terminals 17 are used to monitor the current flowing through the lead wire connecting with the gate of the IGBT and the IGBT itself and also to monitor the temperature of the power semiconductor chip 11. The signal terminals 17 are electrically joined at ends thereof to the pads formed on the first surface of the power semiconductor chip 11 through bonding wires 18 and also exposed at other ends thereof outside the resin-molded assembly 20 for electrical connections with an external device. The spacing between the first surface of the power semiconductor chip 11 and the heat spreader 18 is, as described above, created by the metal block 12, thus ensuring the electrical connections of the power semiconductor chip 11 to the signal terminals 17 without physical and electrical interferences of the bonding wires 18 with the heat spreader 14.

The formation of the resin-molded assembly 20 is made in the following steps. Components, i.e., the power semiconductor chip 11 and a metal terminal are assembled on the heat spreaders 13 with the negative electric terminal 16 by a solder (FIG. 3(a)). Then, signal pads on the first surface of the power semiconductor chip 11 are connected with signal terminals by wires 18. Then, the heat spreader 14 with the positive electric terminal 15 is connected by solder (FIG. 3(b)). A first mold is then formed by a transfer forming machine. The resin-molded assembly 20 is made up of two molds: a thermosetting resin-made body 21 (i.e., the first mode) and a thermoplastic resin-made shell 22 (i.e., a second mold). The thermosetting resin-made body 21 has the above components embedded therein. The thermoplastic resin-made shell 22 functions as a frame to surround or wall the periphery of the thermosetting resin-made body 21.

The thermosetting resin-made body 21 is made of, for example, epoxy, phenol, silicone, or urethane and wraps or insulates the components of the resin molded package 10. The thermosetting resin-made body 21 is so shaped as to have the ends of the positive electric terminal 15, the negative electric terminal 16, and the signal terminals 17 extend outside it and the major surfaces of the heat spreaders 13 and 14 exposed outside it. Of the parts of the resin-molded assembly 20, only the thermosetting resin-made body 21 insulates the components of the resin molded package 10 in a watertight form. The thermosetting resin-made body 21 is of a rectangular shape and has two long side surfaces from one of which the positive electric terminal 15 and the negative electric terminal 16 extend and from the other of which the control terminals 16 extend.

The thermosetting resin-made body 21 in which the components of the resin molded package 10 are disposed is usually referred to as a power card which is permitted to be reused.

The thermoplastic resin-made shell 22 is made of, for example, polyphenylene sulfide (PPS), polybutylene terephthalate, or nylon, polyethylene, or polypropylene resin and covers the periphery of the thermosetting resin-made body 21 so as to have the ends of the positive electric terminal 15, the negative electric terminal 16, and the signal terminals 17 and the surfaces of the heat spreaders 13 and 14 exposed outside it. The thermoplastic resin-made shell 22 is, as illustrated in FIGS. 2(b) and 2(c), formed by discrete two parts: an upper piece 221 and a lower piece 222. The upper and lower pieces 221 and 222 are wrapped around the circumferential wall of the thermosetting resin-made body 22. The thermoplastic resin-made shell 22 has formed therein rectangular windows 22a and 22b from which the surfaces of the heat spreaders 13 and 14 are exposed outside the resin molded package 10.

The thermoplastic resin-made shell 22, as illustrated in FIG. 1, defines a portion of a coolant path 30 working as a cooling mechanism through which cooling medium or refrigerant flows to cool the semiconductor module 1. Specifically, the thermoplastic resin-made shell 22 is made of an enclosed oval plate with long side surfaces extending in parallel to the long side surfaces of the thermosetting resin-made body 21. The thermoplastic resin-made shell 22 has oval holes 22c and recesses 22d formed therein. The holes 22c are located in portions of the thermoplastic resin-made shell 22 which lie, as clearly illustrated in FIG. 2(a), outside the opposed ends of the thermosetting resin-made body 21 and define the portion of the coolant path 30. The recesses 22d are formed in the opposed major surfaces of the thermoplastic resin-made shell 22. The recesses 22d also define, as can be seen from FIG. 1, a portion of the coolant path 30. Specifically, when the resin molded packages 10 are, as illustrated in FIG. 1, stacked to overlap each other, the holes 22c and the recesses 22d of the thermoplastic resin-made blocks 22 complete the coolant path 30.

The thermoplastic resin-made shell 22 has formed in the peripheral edge thereof a seal mount groove 22e which extends around the recess 22d and in which an O-ring 42, as illustrated in FIGS. 1, 2(b), and 2(c), is fit. When the resin molded packages 10 are, as illustrated in FIG. 1, stacked to overlap each other, the O-rings 42 of each of the resin molded packages 10 will be placed in direct abutment with the adjacent resin molded package 10 to create a hermetical seal therebetween which avoids the leakage of cooling water flowing through the coolant path 30 to outside the resinous molds 20.

The semiconductor module 1 also includes, as illustrated in FIG. 1, an upper cover 40, a lower cover 41, and clampers 43.

The upper cover 40 and the lower cover 41 are, as can be seen from FIG. 1, disposed on opposed ends of a stack of the resin molded package 10. The cover 40 is made of a plate contoured to conform with the contour of the resin-molded assembly 20 of each of the resin molded packages 10. When the cover 40 is placed on the end of the stack of the resin molded packages 10, an air gap is created between the second surface of the cover 40 and the recess 22d of an uppermost one of the resin molded packages 10. The lower cover 41 is made of a plate contoured to conform with the contour of the resin-molded assembly 20 of each of the resin molded package 10 and equipped with two pipes 41a and 41b. The pipes 41a and 41b extend substantially perpendicular to the lower cover 41 and communicate with the holes 22c of the resin molded packages 10 which are aligned to define the coolant path 30. The pipe 41a serves as a coolant inlet, while the pipe 41b serves as a coolant outlet. The lower cover 41 also has formed therein a seal mount groove 41c in which the O-ring 42 is fit.

The O-rings 42 are fit in the seal mount holes 22e of the resin molded packages 10 and the seal mount holes 41c of the lower cover 41 to develop hermetical seals between every adjacent two of the resin molded packages 10 and between the resin molded packages 10 and the upper and lower covers 40 and 41.

The dampers 43 function as fastener to firmly join the upper and lower covers 40 and 41 and a stack of the resin molded packages 10 in which the O-rings 42 are disposed in the grooves 22e and 41c to complete the semiconductor module 1. Specifically, each of the dampers 43, as can be seen in FIG. 1, clamps the upper and lower covers 40 and 41 to hold the assembly of the upper and lower cover 40 and 41 and the stack of the resin molded packages 10 tightly, thereby completing the coolant path 30 within the semiconductor module 1. Such an assembly will also be referred to as a module assembly below. The dampers 43 are detachable for disassembling the upper and lower covers 40 and 41 and the resin molded packages 10. Each of the dampers 43 has hooks formed at ends thereof. The interval between the hooks is smaller than the thickness of the module assembly of the upper and lower covers 40 and 41 and the stack of the resin molded packages 10, so that the hooks of each of the dampers 43 may nip the upper and lower covers 40 and 41 elastically. Each of the dampers 43 may alternatively be designed to hold the module assembly using screws instead of the hooks.

The use of the O-rings 42 in the semiconductor module 1 constructed, as described above, creates the hermetic seals among the resin molded packages 10, the upper cover 40, and the lower cover 41, thus avoiding the leakage of the cooling water from the coolant path 30 and ensuring a required degree of cooling the power semiconductor chips 11 of the resin molded packages 10. Specifically, the pipe 41a and one of the two holes 22c of the respective resin molded packages 10, as illustrated in FIG. 1, define an inlet flow path 31, while the pipe 41b and the other hole 22c of the respectively resin molded packages 10 define an outlet flow path 32. The recess 22c formed in the surface of each of the resin molded packages 10 define a branch path 33. The cooling water enters the pipe 41a, flows through the inlet flow path 31, diverges into the branch paths 33, and then discharges from the outlet flow path 32 through the pipe 41b. The cooling water flows in direct contact with the heat spreaders 13 and 14 within the branch paths 33 and cools them, so that the heat, as generated by the power semiconductor chips 11, will be absorbed by the cooling water.

The production method of the semiconductor module 1 will be described below with reference to FIGS. 3(a) to 6(c).

Figure 3A:
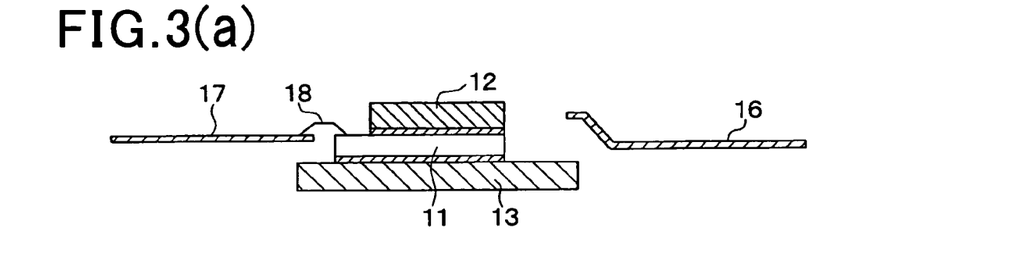
FIGS. 3(a), 3(b), 3(c), and 3(d) are cross sectional views which demonstrate a sequence of steps of producing the resin molded package, as illustrated in FIG. 2(a) to FIG. 2(c)

Step in FIG. 3(a)

The heat spreader 13 with a lead frame in which the positive electric terminal 15, the negative electric terminal 16, and the signal terminals 17 are disposed in place is prepared. The power semiconductor chip 11 on which the semiconductor power device such an IGBT and/or an FWD is fabricated is soldered to the surface of the heat spreader 13. The signal terminals 17 are joined to pads formed on the surface of the power semiconductor chip 11 which lead to, for example, the gate of the semiconductor device through bonding wires 18. The metal block 12 is soldered to the surface of the power semiconductor chip 11.

Figure 3B:
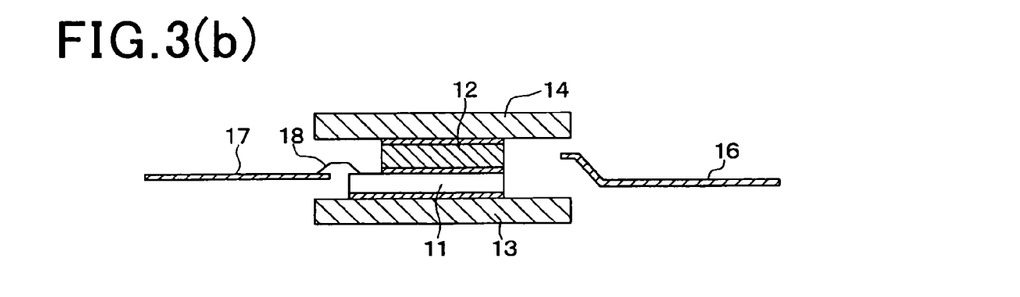

Step in FIG. 3(b)

Solder is put on the surfaces of the metal block 12 and the negative electric terminal 16. The heat spreader 14 with a lead frame is placed on the solder and then joined to the metal block 12. The steps of FIGS. 3(a) and 3(b) form a semiconductor sub-assembly made up of the power semiconductor chip 11, the heat spreaders 13 and 14, the metal block 12, the positive electric terminal 15, the negative electric terminal 16, and the signal terminals 17.

Figure 3C:
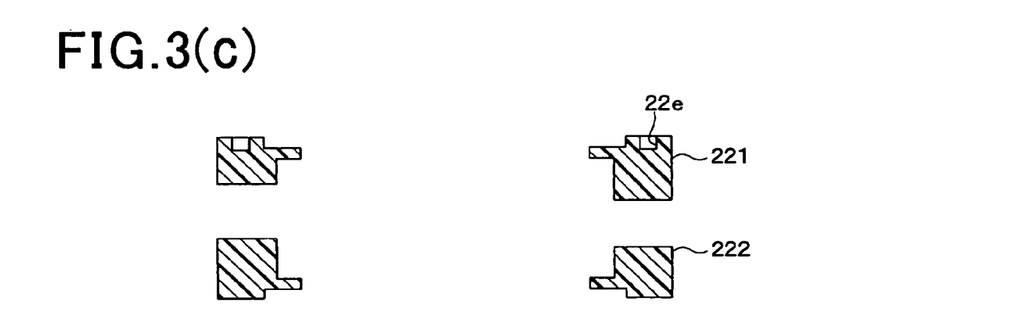

Step in FIG. 3(c)

The upper and lower pieces 221 and 222 of the thermoplastic resin-made shell 22 are prepared. The upper and lower pieces 221 and 222 are made using molding tools, respectively.

Figure 3D:
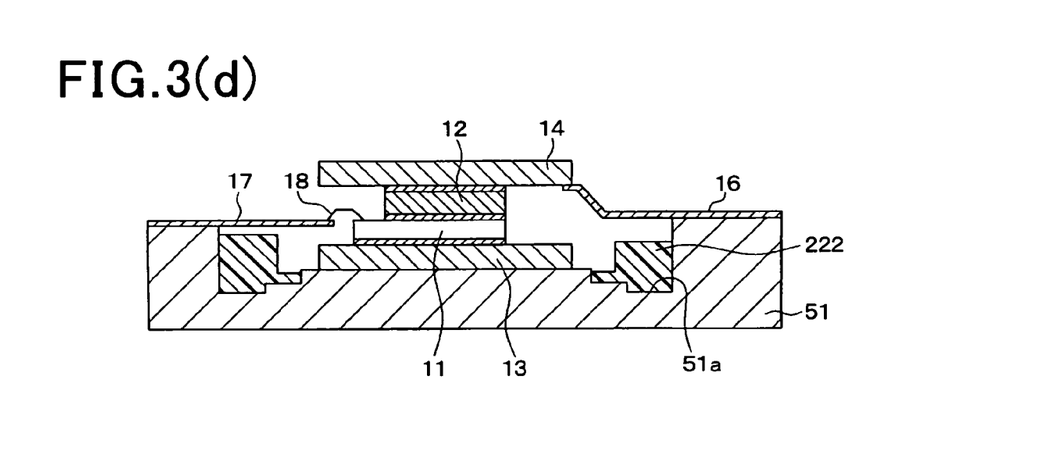

Step in FIG. 3(d)

A lower mold plate 50 of a molding tool of for example, a transfer molding machine is prepared. The lower mold plate 51 has formed therein a cavity 51a which is contoured to conform with the contour of the lower piece 222. The lower piece 222 is put in the cavity 51a. The semiconductor sub-assembly of the components, as prepared in the above steps (i.e., the power semiconductor chip 11, the metal block 12, the heat spreaders 13 and 14 with the lead frames, the signal terminals 17, etc.), as produced in the steps of FIGS. 3(a) and 3(b), is put in the lower piece 222.

Figure 4A:
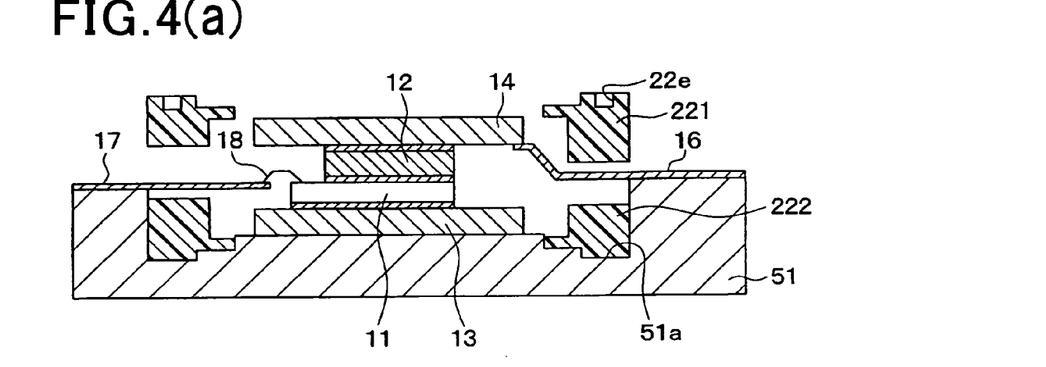
FIGS. 4(a), 4(b), and 4(c) are cross sectional views which demonstrate a sequence of steps of producing a thermosetting resin-made mold of the resin molded package, as illustrated in FIGS. 2(a) to 2(c)

Step in FIG. 4(a)

The upper piece 221 is placed above the lower piece 222 at a given interval away from each other. The upper and lower pieces 221 and 222 have pins and holes (not shown) formed on or in portions thereof, respectively, which do not interfere with the lead frames and the signal terminals 17. The pins are inserted into the holes to position the upper and lower pieces 221 and 222 relative to each other.

Figure 4B:
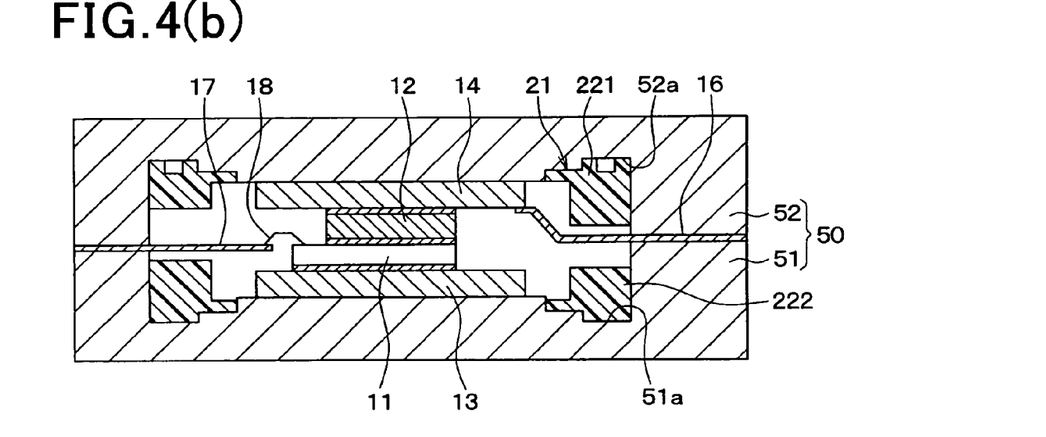
Figure 4C:
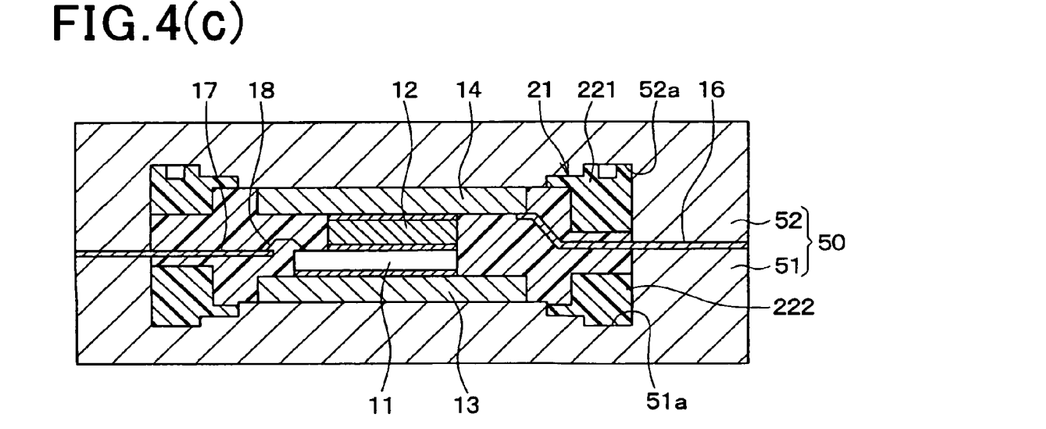

Step in FIG. 4(b)

An upper mold plate 52 of the molding tool is prepared. The upper mold plate 52 is placed on the lower mold plate 51 on or in which the lower piece 222 and the other components are disposed. When the upper mold plate 52 is put on the lower mold plate 51, a cavity will be, as can be seen from, FIG. 4(b), formed which is contoured to conform with the contour of the thermosetting resin-made body 21.

Step in FIG. 4(c)

The thermosetting resin such as epoxy resin is injected into the cavity through a resin-inlet (not shown) formed in the molding tool 50, thereby molding the thermosetting resin-made body 21. Afterwards, the upper and lower mold plates 52 and 51 are disassembled to complete the resin molded package 10. The lead frames of the heat spreaders 13 and 14 may be removed in this step.

Figure 6:
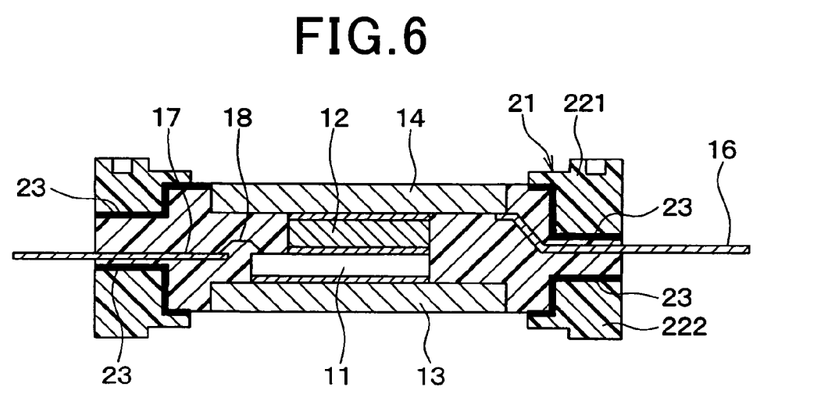
FIG. 6 is a cross sectional view which shows adhered interfaces between a thermosetting resin-made mold and a thermoplastic resin-made mold of the resin molded package of FIGS. 2(a) to 2(c)

As apparent from the above discussion, the thermosetting resin-made body 21 is formed after the thermoplastic resin-made shell 22 is made, This will cause a high degree of adhesion of the thermosetting resin-made body 21 to the thermoplastic resin-made shell 22 to be created before the thermosetting resin-made body 21 is hardened, thereby forming firmly adhered interfaces between the thermosetting resin-made body 21 and the thermoplastic resin-made shell 22. FIG. 6 illustrates the adhered interfaces 23 between the thermosetting resin-made body 21 and the thermoplastic resin-made shell 22, The adhered interfaces 23, as indicated by solid lines in FIG. 6, extend entirely over opposed outer surfaces of the thermosetting resin-made body 21 and the thermoplastic resin-made shell 22, thereby ensuring a firm physical joint therebetween without any clearances.

The thermoplastic resin-made shell 22 is located away from the positive electric terminal 15, the negative electric terminal 16, and the signal terminals 17 through the thermosetting resin-made body 21, in other words, the positive electric terminal 15, the negative electric terminal 16, and the signal terminals 17 do not occupy the interface between the thermosetting resin-made body 21 and the thermoplastic resin-made shell 22, thus ensuring a high-degree of adhesion between the thermosetting resin-made body 21 and the thermoplastic resin-made shell 22.

Figure 5A:
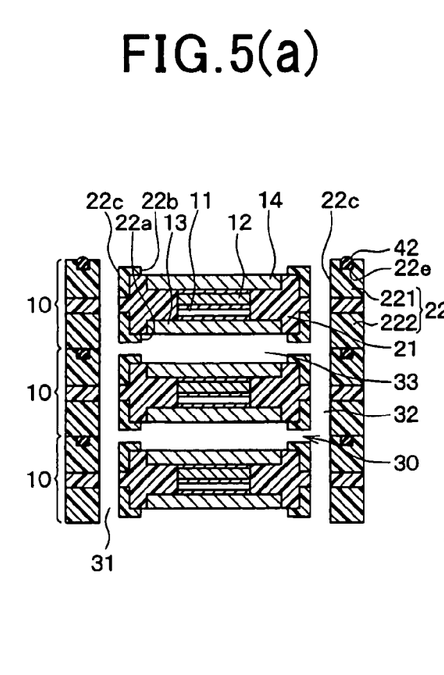
FIGS. 5(a), 5(b), and 5(c) are cross sectional views which demonstrate a sequence of steps of assembling the semiconductor module, as illustrated in FIG. 1.

Step in FIG. 5(a)

A plurality of the resin molded packages 10 each of which has been produced in the steps of FIGS. 3(a) to 4(c) are prepared. For example, the three resin molded packages 10 are prepared. The O-ring 42 is fitted in the groove 22e of the thermoplastic resin-made shell 22 of each of the resin molded packages 10.

Figure 5B:
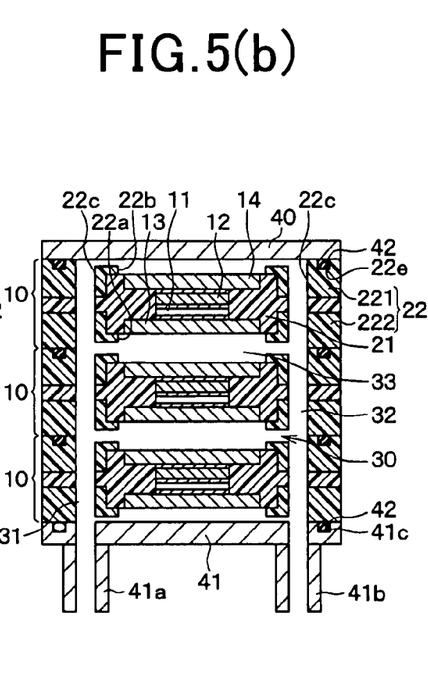

Step in FIG. 5(b)

The upper and lower covers 40 and 41 are prepared. The O-ring 42 is fitted in the seal mount groove 41c of the lower cover 41. The upper cover 40 is place on one of opposed ends of the package stack, while the lower cover 41 is placed on the other end of the package stack. Such an assembly will also be referred to as a module assembly below.

Figure 5C:
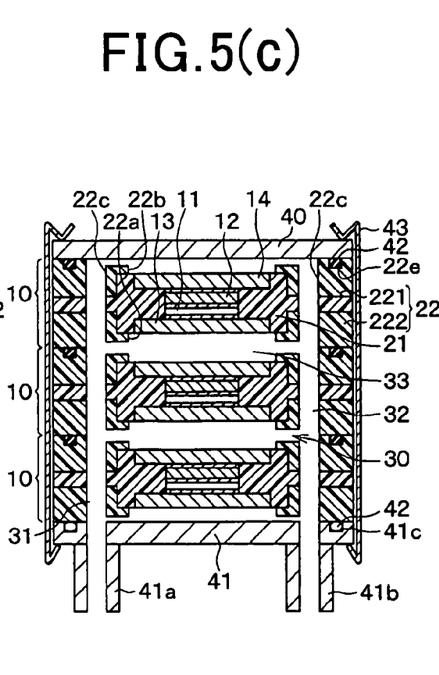

Step in FIG. 5(c)

The package stack and the upper and lower cover 40 and 41 which are assembled in the above steps are retained tightly by the clamps 43 to complete the semiconductor module 1, as illustrated in FIG. 1.

If one of the resin molded packages 10 of the semiconductor module 1 has been damaged or broken during the production or use thereof, it may be replaced in the manner as described below.

The dampers 43 are removed from the module assembly of the upper and lower covers 40 and 41 and the package stack. For instance, the removal of the damper 43 is achieved by deforming the hooks thereof elastically. In the case where the damper 43 is fixed to the module assembly using screws, the removal of the damper 43 is achieved by loosening the screws.

If the resin-molded assembly 20 of one of the resin molded packages 10 is damaged or scratched, an operator identifies it, disassembles the upper cover 40, the resin molded packages 10, and the lower cover 41, and removes the scratched resin molded package 10.

The damaged resin molded package 10 is put in a thermal processing machine such as a heating furnace and then heated at a temperature which is selected based on a glass transition temperature at which resin subjected to heat decreases suddenly in rigidity and viscosity thereof, so that it has the flowability, for example, to be higher than or equal to the glass transition temperature a softening temperature) of the thermoplastic resin-made shell 22 and lower than the glass transition temperature of the thermosetting resin-made body 21. In the case where the thermoplastic resin-made shell 22 is made of polyphenylene sulfide, and the thermosetting resin-made body 21 is made of epoxy resin, the damaged resin molded package 10 is heated at 120° C. which is higher than or equal to the glass transition temperature of the polyphenylene sulfide and lower than the glass transition temperature of the epoxy resin. The glass transition temperature usually depends upon amounts of resin and filler. A desired value of the glass transmission temperature of the thermoplastic resin-made shell 22 or the thermosetting resin-made body 21 is, therefore, determined by selecting the amounts of resin and filler thereof.

The damaged resin molded package 10 continues to be heated in the thermal processing machine, so that only the thermoplastic resin-made body 22 is softened and permitted to be removed from the resin molded package 10 to leave only the power card (i.e., the thermosetting resin-made body 21) as it is. Note that the thermoplastic resin is in a state intermediate between solid and liquid at the above temperature, so that it does not disappear naturally, but may be removed easily from the resin molded package 10 by pushing or pulling the thermoplastic resin-made body 22.

The power card made by the thermosetting resin-made body 21 by which the components are encapsulated is put in the same mold as used in forming the thermoplastic resin-made shell 22. Thermoplastic resin is injected into the mold to form the thermoplastic resin-made shell 22 so as to cover the outer periphery of the power card, thereby rebuilding the resin molded package 10.

The rebuilt resin molded package 10 and the above described remaining resin molded packages 10 are stacked in the same manner as described above, The upper and lower covers 40 and 41 are placed on the opposed ends of the package stack and the nipped by the dampers 43 to rebuilding the semiconductor module 1.

This enables portions of the resin molded package 10 other than the thermoplastic resin-made shell 22 to be reused without disposing the components of the resin molded package 10 such as the power semiconductor chip 11, the heat spreaders 13 and 14, etc.

The rebuilding of the resin molded package 10 is, as described above, achieved by injecting the thermoplastic resin into the mold within which the power card (i.e., the thermosetting resin-made body 21 is already disposed to form the thermoplastic resin-made shell 22, which may result in a lack of adhesion between the thermosetting resin-made body 21 and the thermoplastic resin-made shell 22, leading to a concern about leakage of the coolant from the coolant path 30 especially when the pressure of the coolant is high. In such an event, the resin molded package 10, as produced by the steps of FIGS. 3(a) to 4(c), may be used in rebuilding the semiconductor module 1 in place of the damaged resin molded package 10. The damaged resin molded package 10 may be utilized as the power card for other types of products.

As apparent from the above discussion, the components (e.g., the power semiconductor chip 11, etc.) of the resin molded package 10 is encapsulated by the thermosetting resin-made body 21 to ensure required heat resistance properties thereof. Additionally, the periphery of the thermosetting resin-made body 21 is covered by the thermoplastic resin-made shell 22. The thermoplastic resin-made shell 22 defines a portion of the coolant path 30. The coolant path 30 is completed when the resin molded packages 10 are assembled as the semiconductor module 1 and works as a cooling mechanism to dissipate the heat from the resin molded packages 10.

If one of the resin molded packages 10 is broken, the structure of the semiconductor module 1 permits it to be replaced with another one, thereby enabling the semiconductor module 1 to be reused. If only the thermoplastic resin-made shell 22 is damaged, it may be thermally softened and removed from the resin molded package 10 to leave the thermosetting resin-made body 21 (i.e., the power card) as it is. The thermosetting resin-made body 12 may be used again to rebuild the resin molded package 10. This eliminates the need for discarding the components of the resin molded package 10 such as the power semiconductor chip 11, etc.

If any one of the resin molded packages 10 is broken, and the surface of another of the resin molded packages 10 is damaged or scratched while the semiconductor module 1 is being disassembled, the structure of the resin molded package 10 enables the components thereof such as the power semiconductor chip 11, etc. to be reused for resources.

The thermosetting resin-made body 21 is, as described above, formed after the thermoplastic resin-made shell 22 is made. This will cause a high degree of adhesion of the thermosetting resin-made body 21 to the thermoplastic resin-made shell 22 to be created before the thermosetting resin-made body 21 is hardened, thereby developing a firm joint between the thermosetting resin-made body 21 and the thermoplastic resin-made shell 22 without any air gaps therebetween. This avoids the leakage of the coolant to the thermosetting resin-made body 21.

Figure 7:
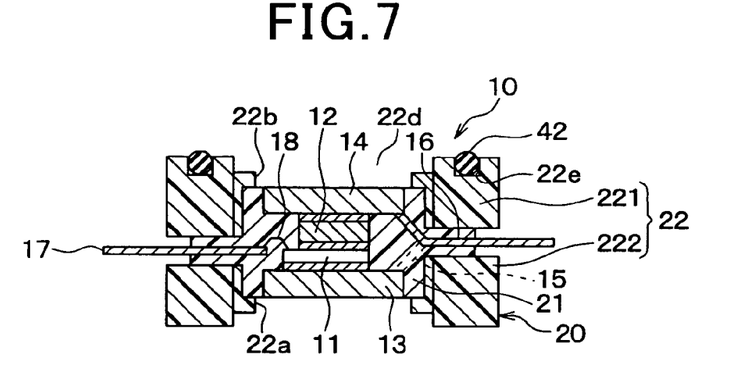
FIG. 7 is a transverse sectional view which shows a modification of the resin molded package of FIGS. 2(a) to 2(c)

FIG. 7 illustrates a modification of the resin molded package 10. The resin molded package 10 of the above embodiment is, as can be seen from FIG. 6, designed such that the circumferential surface of the thermosetting resin-made body 21 lies flush with that of the thermoplastic resin-made shell 22 and may be damaged easily. The structure of FIG. 7 minimizes such a problem. Specifically, the circumferential surface of the thermosetting resin-made body 21 is located radially inwardly of that of the thermoplastic resin-made shell 22 to minimize the risk of being damaged physically.

Figure 8:
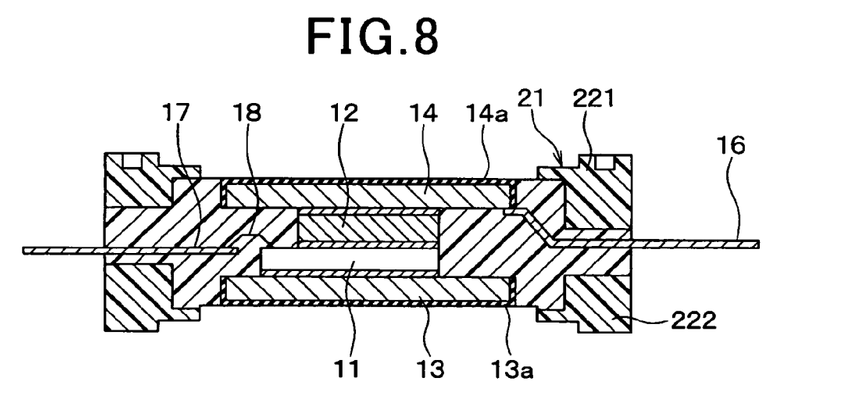
FIG. 8 is a cross sectional view which shows a resin molded package according to the second embodiment.

The semiconductor module 1 according to the second embodiment will be described below which is different in structure of the heat spreaders 13 and 14 from that of the first embodiment. Other arrangements are identical, and explanation thereof in detail will be omitted here.

FIG. 8 is a transverse cross sectional view which illustrates one of resin molded packages 10 making up the semiconductor modules 1 of the second embodiment.

The resin molded package 10 includes insulating films 13a and 14a which extend over the outer major surfaces and the circumferences of the heat spreaders 13 and 14, respectively. In other words, the insulating films 13a and 14a are wrapped about areas of the heat spreaders 13 and 14 through which the heat spreaders 13 and 14 do not electrically connect with the components of the resin molded package 10.

Each of the heat spreaders 13 and 14 have the major surfaces which are farther away from the power semiconductor chip 11 and exposed to the flow of coolant to enhance the cooling ability of the heat spreaders 13 and 14. When water which conducts electricity is used as the coolant, it may result in leakage of electricity from the heat spreaders 13 and 14, which leads to a short circuit between the heat spreaders 13 and 14 of adjacent two of the resin molded packages 10. In order to avoid this problem, the insulating films 13a and 14a are affixed to the areas of the heat spreaders 13 and 14 which are exposed outside the thermosetting resin-made body 21. The formation of the insulating films 13a and 14a may be achieved using spray coating techniques.

The insulating films 13a and 14a may alternatively be formed only the outside major surfaces of the heat spreaders 13 and 14.

Figure 9:
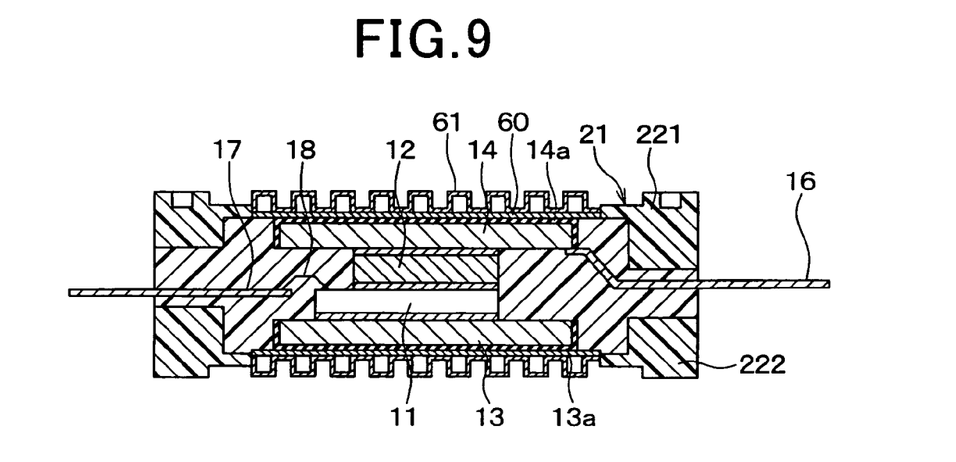
FIG. 9 is a cross sectional view which shows a resin molded package according to the third embodiment.

The semiconductor module 1 according to the third embodiment will be described below which is different in structure of the cooling mechanism from that of the second embodiment. Other arrangements are identical, and explanation thereof in detail will be omitted here.

FIG. 9 is a transverse cross sectional view which illustrates one of resin molded packages 10 making up the semiconductor modules 1 of the third embodiment.

The resin molded package 10 includes metallic fin heat sinks 61 disposed over the surfaces of the insulating films 13a and 14a through metallic films 60, respectively. The fin heat sinks 61 are exposed the coolant flowing through the coolant path 30 to transfer the heat from the heat spreaders 13 and 14 to the coolant.

The metallic films 60 are made from, for example, aluminum. The fin heat sinks 61 are also made from, for example, aluminum. Each of the fm heat sinks 61 may be of a pin-type with a plurality of pins, a straight-type with a plurality of plates, or a flared (or waved) type with a plurality of flared plates. The fin heat sinks 61 increase the surface area in contact with the coolant flowing through the coolant path 30 and also serve to create turbulence flows of the coolant, thereby enhancing the ability of cooling the resin molded package 10.

The resin molded package 10, like the second embodiment, has the insulating films 13a and 14a wrapped about the outer major surfaces and the circumferential surfaces of the heat spreaders 13 and 14, thus avoiding the leakage of electricity from the heat spreaders 13 and 14.

The fin heat sinks 61 may be blued directly to the insulating films 13a and 14a through an electrically conductive bonding material. The strength of joint of the fin heat sinks 61 to the insulating films 13a and 14a may, however, decrease depending upon the shape of the fin heat sinks 61. The use of the metallic films 60 ensures a required degree of adhesion of the fin heat sinks 61 to the insulating films 13a and 14a. The fin heat sinks 61 may be affixed to the metallic films 60 using ultrasonic bonding techniques. The metallic films 60 have flat surfaces and may be stuck directly to the insulating films 13a and 14a of the heat spreaders 13 and 14 using an electrically conductive bonding material.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

For example, the semiconductor module 1 has been described as being used in the inverter for driving the three-phase electric motor, but may alternatively be used with other types of electrical devices.

The coolant flowing through the coolant path 30 may be water or another type of cooling medium.

The semiconductor module 1 may be made to include the only one resin molded package 10 which is retained tightly between the upper and lower covers 40 and 41 through the clampers 43.

What is claimed is:

1. A method of producing a semiconductor module which includes a resin molded package and a coolant path comprising:
    a first step of preparing a semiconductor sub-assembly of a power semiconductor chip, a first heat spreader, a second heat spreader, and electric terminals, the power semiconductor chip having a first and a second surface opposed to each other and being equipped with a semiconductor power device connecting with the electric terminals;
    a second step of forming a thermoplastic resin-made mold which defines a shell of the resin molded package;
    a third step of placing the thermoplastic resin-made mold and the semiconductor sub-assembly in a given molding tool and then forming a thermosetting resin-made mold inside the thermoplastic resin-made mold to make, as the resin molded package, a resin-molded assembly in which a coolant path defining said coolant path is formed, the first heat spreader being disposed in connection with the first surface of the power semiconductor chip, the second heat spreader being disposed in connection with the second surface of the power semiconductor chip, each of the electric terminals having a portion exposed from the resin-molded assembly, material for the thermosetting resin-made mold being higher in glass transition temperature than that for the thermoplastic resin-made mold; and
    a fourth step of holding the resin molded package through covers to complete the semiconductor module.

2. A method as set forth in claim 1, wherein the third step injects thermosetting resin into the molding tool within which the thermoplastic resin-made mold and the semiconductor sub-assembly are already disposed to form the thermosetting resin-made mold.

3. A method as set forth in claim 2, wherein the thermosetting resin is one of epoxy, phenol, silicone, and urethane.

4. A method as set forth in claim 1, wherein the third step places the thermoplastic resin-made mold away from the electric terminals of the semiconductor sub-assembly within the molding tool and injects thermosetting resin also into an air gap between the thermoplastic resin-made mold and the electric terminals.

5. A method as set forth in claim 4, wherein the thermoplastic resin is one of polyphenylene sulfide, polybutylene terephthalate, nylon, polyethylene, and polypropylene.

6. A method of producing a semiconductor module which includes resin molded packages and a coolant path comprising:
    a first step of preparing a semiconductor sub-assembly of a power semiconductor chip, a first heat spreader, a second heat spreader, and electric terminals, the power semiconductor chip having a first and a second surface opposed to each other and being equipped with a semiconductor power device connecting with the electric terminals;

a second step of forming a thermoplastic resin-made mold which defines a shell of the resin molded package;

a third step of placing the thermoplastic resin-made mold and the semiconductor sub-assembly in a given molding tool and then forming a thermosetting resin-made mold inside the thermoplastic resin-made mold to make, as one of the resin molded packages, a resin-molded assembly in which a coolant path defining said coolant path is formed, the first heat spreader being disposed in connection with the first surface of the resin molded package, the second heat spreader being disposed in connection with the second surface of the power semiconductor chip, each of the electric terminals having a portion exposed outside the resin-molded assembly, material for the thermosetting resin-made mold being higher in glass transition temperature than that for the thermoplastic resin-made mold;

a fourth step of performing the first, second, and third step to make another of the resin molded package; and a fifth step of making a stack of the resin molded packages as a package stack and holding the package stack through covers to complete the semiconductor module.

7. A method as set forth in claim 6, wherein the third step injects thermosetting resin into the molding tool within which the thermoplastic resin-made mold and the semiconductor sub-assembly are already disposed to form the thermosetting resin-made mold.

8. A method as set forth in claim 7, wherein the then thermosetting resin is one of epoxy, phenol, silicone, and urethane.

9. A method as set forth in claim 6, wherein the third step places the thermoplastic resin-made mold away from the electric terminals of the semiconductor sub-assembly within the molding tool and injects thermosetting resin also into an air gap between the thermoplastic resin-made mold and the electric terminals.

10. A method as set forth in claim 9, wherein the thermoplastic resin is one of polyphenylene sulfide, polybutylene terephthalate, nylon, polyethylene, and polypropylene.

\* \* \* \* \*